(12) United States Patent
Chen et al.

(10) Patent No.: US 7,206,197 B2
(45) Date of Patent: Apr. 17, 2007

(54) COMPUTER POWER SUPPLY MOUNTING APPARATUS

(75) Inventors: Yun-Lung Chen, Tu-Cheng (TW); Pei-Bin Luo, Shenzhen (CN)

(73) Assignees: Hong Fu Jin Precision Indusrty (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 261 days.

(21) Appl. No.: 10/972,628

(22) Filed: Oct. 25, 2004

(65) Prior Publication Data
US 2005/0122673 A1 Jun. 9, 2005

(30) Foreign Application Priority Data
Dec. 9, 2003 (TW) .............................. 92221604 U

(51) Int. Cl.
*G06F 1/16* (2006.01)
(52) U.S. Cl. .................... 361/683; 361/724; 312/223.1
(58) Field of Classification Search ................ 361/683, 361/679, 724–727; 312/223.1, 223.2
See application file for complete search history.

(56) References Cited
U.S. PATENT DOCUMENTS

| | | | |
|---|---|---|---|
| 5,745,342 A * | 4/1998 | Jeffries et al. ............... | 361/683 |
| 5,777,848 A * | 7/1998 | McAnally et al. .......... | 361/725 |
| 5,790,372 A | 8/1998 | Dewey et al. | |
| 6,229,696 B1 * | 5/2001 | Lin et al. ..................... | 361/683 |
| 6,270,046 B1 | 8/2001 | Liu et al. | |
| 6,288,332 B1 * | 9/2001 | Liu et al. ..................... | 361/683 |
| 6,483,696 B1 * | 11/2002 | Gan ........................... | 361/683 |
| 6,530,628 B1 * | 3/2003 | Huang et al. ............. | 312/223.2 |
| 6,582,150 B1 * | 6/2003 | Davis et al. ................ | 361/725 |
| 6,751,100 B2 * | 6/2004 | Chen .......................... | 361/725 |

* cited by examiner

*Primary Examiner*—Lisa Lea-Edmonds
(74) *Attorney, Agent, or Firm*—Morris Manning & Martin LLP; Tim Tingkang Xia, Esq.

(57) ABSTRACT

A computer power supply mounting apparatus includes a fixing member (40) to mount a power supply (60) into a computer chassis (20). The power supply has a front panel (62), a side panel (64) and a back panel (66). A pair of hooks (642) is formed on the side panel. The fixing member is slidably attached to the front panel of the power supply. The fixing member has a body (42) with a pair of posts (422) extending therefrom. The computer chassis includes a rear plate (22) and a side plate (24) for respectively abutting against the back panel and the side panel of the power supply. At least one rack (224) is formed on the chassis for supporting the power supply. A pair of receiving slots (242) and a pair of receiving holes (244) are defined in the side plate for respectively retaining the hooks of the power supply and the posts of the fixing member.

20 Claims, 5 Drawing Sheets

US 7,206,197 B2

COMPUTER POWER SUPPLY MOUNTING APPARATUS

BACKGROUND OF THE INVENTION

1. Field of the Invention

The present invention relates to a computer power supply, and particularly to a computer power supply mounting apparatus.

2. Description of the Related Art

Many types of electronic devices, such as computers, include a power supply which is mounted in a housing or chassis along with the other circuits, components, and peripheral devices. Since the power supply receives alternating current electrical power and converts the alternating current to direct current for operating the various electrical components, safety regulations require that the power supply be completely enclosed in a case to prevent access to potentially harmful high voltages. In the past, most power supplies were mounted to the chassis using several screws, making it difficult and time consuming to replace or remove the power supply for repair.

In U.S. Pat. No. 5,790,372, an improved power supply mounting apparatus is disclosed. A computer includes a chassis and a power supply mounted in the chassis. One or more hooks are provided on the chassis and the power supply, so that the power supply can be placed in the chassis and moved relative to the chassis to engage the hooks and secure the power supply in the chassis against movement in a first plane. A screw is provided for engaging the chassis and the power supply for securing the power supply against movement in a plane perpendicular to the first plane. A tab on a wall of the chassis guides the power supply.

In U.S. Pat. No. 6,270,046, another improved power supply mounting apparatus is disclosed. A computer system includes a chassis which is formed by assembling front, rear and bottom panels together. An apparatus for mounting a switching power supply to the computer system includes a bracket and a drive cage with a pair of hooks. The drive cage bridges between the front and rear panels. The bracket includes a hinge portion and a supporting portion adapted to support the switching power supply. The hinge portion of the bracket is slidably engaged with the hooks for fixing the switching power supply to the rear panel of the chassis with screws.

Therefore, what is needed is an screwless apparatus for mounting a power supply, thereby to enable easy and convenient installation and removal of the power supply.

SUMMARY OF THE INVENTION

Accordingly, an object of the present invention is to provide a screwless power supply mounting apparatus to enable easy and convenient installation and removal of a power supply.

To achieve the above-mentioned object, a computer power supply mounting apparatus in accordance with a preferred embodiment of the present invention includes a fixing member to mount a power supply into a computer chassis. The power supply has a front panel, a side panel and a back panel. A pair of hooks is formed on the side panel. The fixing member is slidably attached to the front panel of the power supply. The fixing member has a body with a pair of posts extending therefrom. The computer chassis includes a rear plate and a side plate for respectively abutting against the back panel and the side panel of the power supply. At least one rack is formed on the chassis for supporting the power supply. A pair of receiving slots and a pair of receiving holes are defined in the side plate for respectively retaining the hooks of the power supply and the posts of the fixing member.

Other objects, advantages and novel features of the present invention will be drawn from the following detailed description of the preferred embodiments of the present invention with the attached drawings, in which:

DETAILED DESCRIPTION OF THE INVENTION

Figure 1:
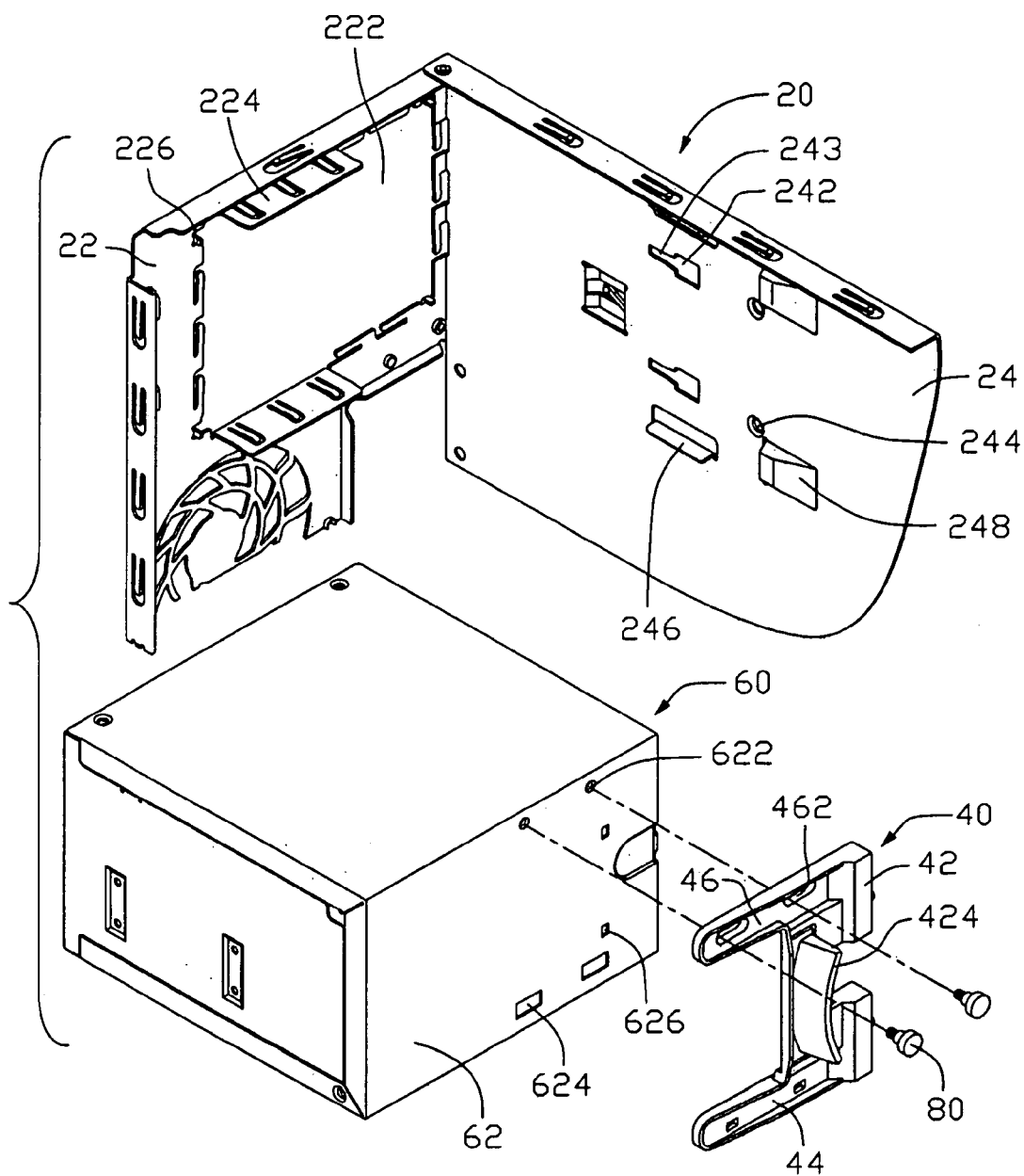
FIG. 1 is an exploded, isometric view of a computer power supply mounting apparatus in accordance with the preferred embodiment of the present invention.

Referring to FIG. 1, a computer in accordance with the preferred embodiment of the present invention comprises a chassis 20, a fixing member 40 and a power supply 60.

Figure 2:
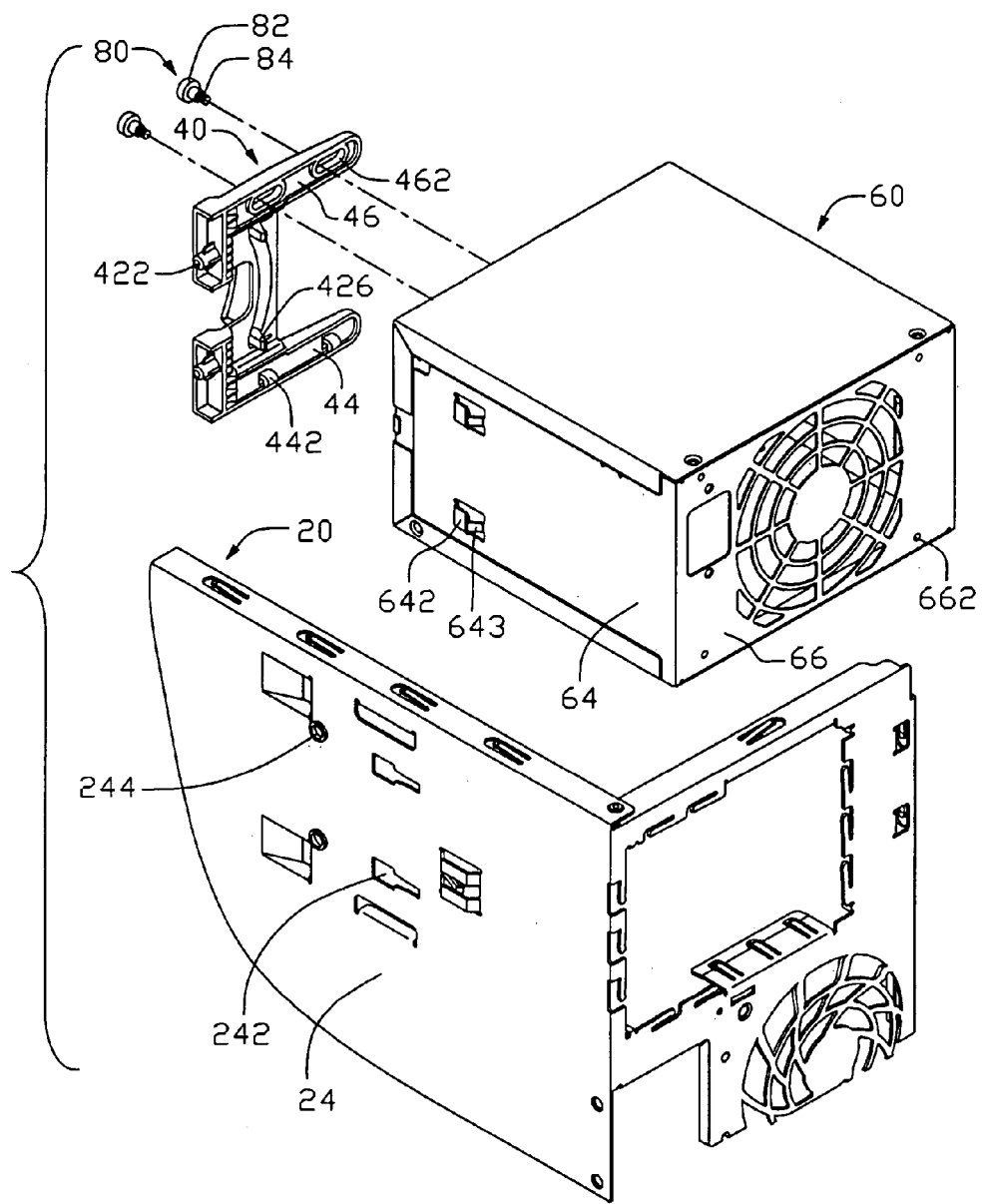
FIG. 2 is an exploded, isometric view of FIG. 1, but viewed from another perspective.

The power supply 60 has a front panel 62, a side panel 64 and a back panel 66 (referring also to FIG. 2). A pair of screw holes 622 and a pair of grooves 624 are respectively defined at a top and a bottom of the front panel. A pair of pits 626 is defined between the pair of screw holes 622 and the pair of grooves 624. As shown in FIG. 2, a pair of hooks 642 is stamped outward on the side panel 64. Each hook 642 has a guiding tab 643 at the end thereof connecting with the side panel 64. A through hole 662 is defined at each corner of the back panel 66.

Referring to FIG. 1, the chassis 20 has a rear plate 22 and a side plate 24. An opening 222 is defined at a top of the rear plate 22 with racks 224 bent inward for supporting the power supply 60. A protrusion 26 extends inwardly at each corner of the opening 222 for inserting into the through hole 662 in the back panel 66 of the power supply 62.

Corresponding to the racks 224 on the rear plate 22, a pair of racks 246 is stamped inwardly from the side plate 24 for supporting the power supply 60. Between the pair of supporting racks 246, a pair of receiving slots 242 is defined for engaging with the hooks 642 on the side panel 64 of the power supply 60. Each receiving slot 242 has a narrow guiding portion 243 corresponding to the guiding tab 643 of the hooks 642. A pair of receiving holes 244 is defined adjacent to the receiving slots 242 on the side plate 24. Next to the receiving holes 244, a pair of bulges 248 is stamped inwardly.

The fixing member 40 has an U-shaped body 42 with a first arm 44 and a second arm 46 parallel extending. A pair of crooks 442 is formed inwardly on the first arm 44 (as shown in FIG. 2), for extending into the grooves 624 in the power supply 60 and sliding therein. A pair of slots 462 is defined in the second arm 46, for a pair of screws 80 sliding therein. The screws 80 are inserted into the screw holes 622 respectively. A pair of resilient clasps 426 is formed on the inner side of the fixing member 40 for engaging with the pits 626. A pair of posts 422 extends upward on the lateral side of the body 42 for inserting into the receiving holes 244 in the side plate 24.

When the fixing member 40 is attached to the power supply 60, the crooks 442 of the first arm 44 are respectively inserted into the grooves 624 of the power supply 60 initially. The slots 462 of the second arm 46 are aligned to the screw holes 622 in the power supply 60 respectively. A pair of screws 80 extends through the slots 462, and inserts into the screw holes 622.

Figure 3:
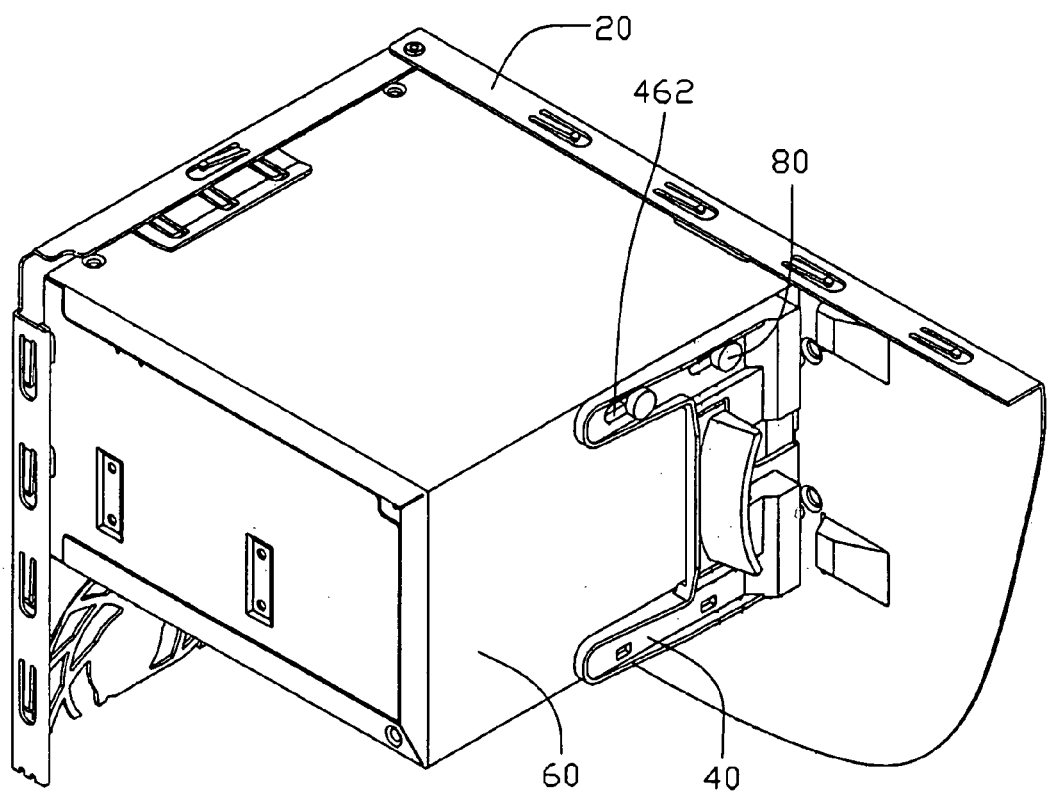
FIG. 3 is an isometric view of the present invention, showing a power supply ready to be mounted.

In assembly, the power supply 60 abuts against the side plate 24. The hooks 642 of the power supply 60 are inserted into the receiving slots 242 of the side plate 24 respectively. The power supply 60 is supported by the racks 246. The power supply 60 is pushed forward to abut against the rear plate 22. The hooks 642 of the power supply 60 engage with the receiving slots 242 of the side plate 24. The protrusions 226 on the rear plate 22 insert into the through hole 662 in the rear panel 66 of the power supply 60 respectively. The power supply 60 is supported by the racks 224 of the rear plate 22 also (referring to FIG. 3).

Figure 4:
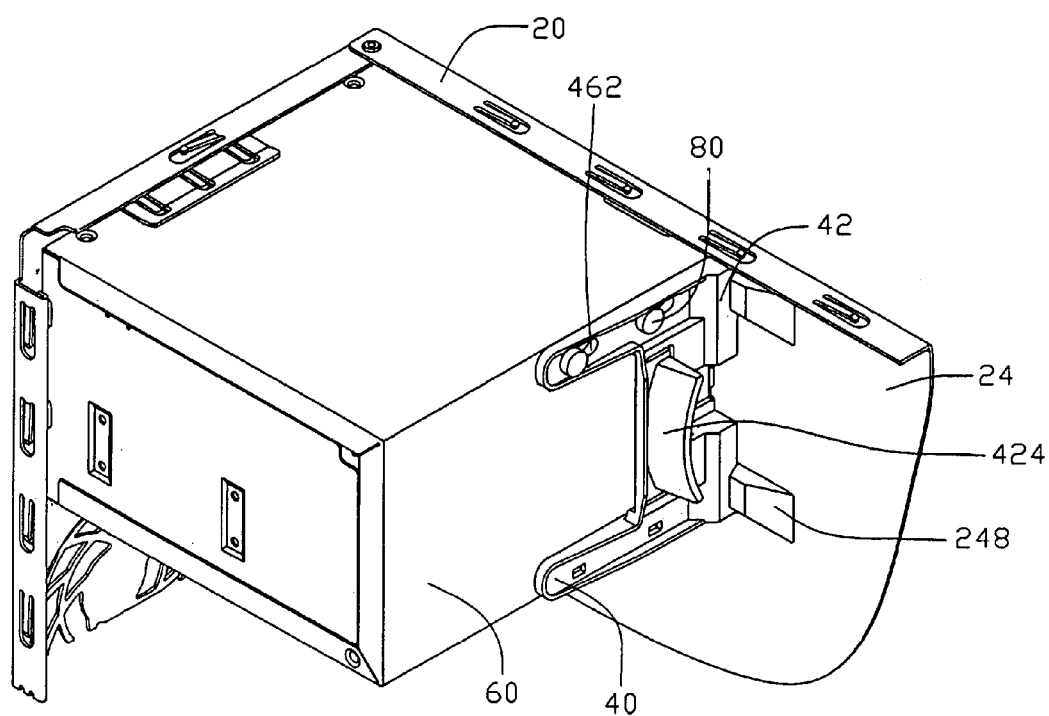
FIGS. 4 and 5 are assembled views of the present invention, but viewed from different perspective.
Figure 5:
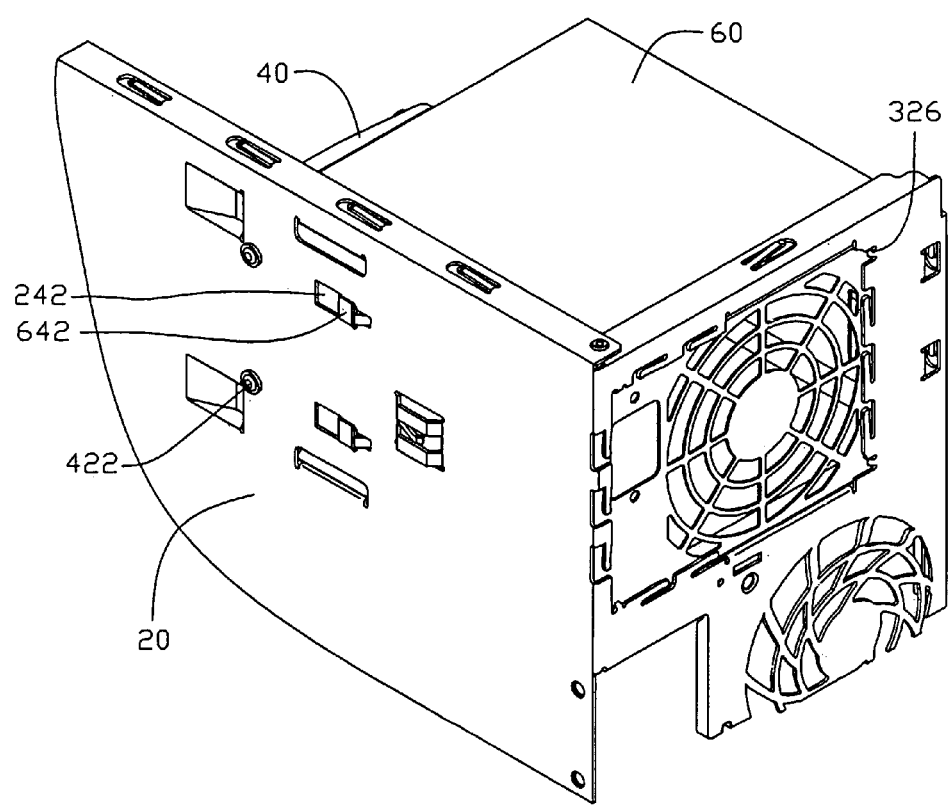

Referring to FIG. 4, the fixing member 40 is pushed forward by holding the handle 424. The fixing member 40 slides smoothly since the screws 80 slide in the slots 462 and the crooks 442 slide in the grooves 624. The pair of posts 422 is inserted into the pair of receiving holes 244 respectively. The body 42 of the fixing member 40 abuts against the bugles 248 of the side plate 24. The pair of resilient clasps 426 slides into the pair of pits 626 in the power supply 60 and engages therewith, so that the fixing member 40 will not slide back. Thereby, the power supply 60 is secured in the chassis 20.

In disassembly, the fixing member 40 is pushed backward to have the posts 422 withdrawn from the receiving holes 244. The power supply 60 is ready to be detached from the chassis 20.

It is understood that the invention may be embodied in other forms without departing from the spirit thereof. Thus, the present examples and embodiments are to be considered in all respects as illustrative and not restrictive, and the invention is not to be limited to the details given herein.

We claim:

1. A computer power supply mounting apparatus comprising:
   a computer chassis including a rear plate and a side plate for abutting against a power supply, at least one rack formed on the chassis for supporting the power supply; and
   a fixing member adapted for being slidably attached to a panel of the power supply opposite to the rear plate of the chassis, the fixing member having a body movable along the panel of the power supply toward the chassis in a direction which the fixing member slides so as to have a portion of said body engagable with the chassis to fix the power supply therein.

2. The computer power supply mounting apparatus as claimed in claim 1, wherein said portion of said body is at least one post extending from said body, and at least one receiving hole is defined in the chassis to allow said at least one post being engagable therewith.

3. The computer power supply mounting apparatus as claimed in claim 1, wherein a first arm and a second arm parallel extend from the body of the fixing member.

4. The computer power supply mounting apparatus as claimed in claim 3, wherein at least one crook is formed on the first arm for slidably engaging with the power supply.

5. The computer power supply mounting apparatus as claimed in claim 3, wherein at least one slot is defined in the second arm for slidably engaging with the power supply.

6. The computer power supply mounting apparatus as claimed in claim 1, wherein at least one protrusion extend inwardly from the rear plate for engaging with the power supply.

7. The computer power supply mounting apparatus as claimed in claim 1, wherein at least one bulge is formed on the side plate for abutting against the fixing member.

8. A computer comprising:
   a power supply having a front panel, a side panel and a back panel, at least one hook being formed on the side panel;
   a fixing member slidably attached to the front panel of the power supply, the fixing member having a body, at least one post extending from the body; and
   a computer chassis including a rear plate and a side plate for respectively abutting against the back panel and the side panel of the power supply, at least one receiving slot and at least one receiving hole being defined in the side plate for respectively retaining said hook of the power supply and said post of the fixing member.

9. The computer as claimed in claim 8, wherein said post extends in a direction which the fixing member slides in.

10. The computer as claimed in claim 8, wherein a first arm and a second arm parallel extend from the body of the fixing member.

11. The computer as claimed in claim 10, wherein at least one crook is formed on the first arm for slidably engaging with the power supply.

12. The computer as claimed in claim 10, wherein at least one slot is defined in the second arm, and at least one screw is attached to the power supply for sliding along said slot.

13. The computer as claimed in claim 8, wherein at least one resilient clasp is formed on the inner side of the fixing member, and at least one pit is defined in the power supply corresponding to said resilient clasp.

14. The computer as claimed in claim 8, wherein at least one bulge is formed on the side plate for abutting against the fixing member.

15. The computer as claimed in claim 8, wherein said hook has a guiding tab at the end thereof connecting with the side panel, and said receiving slot of the side plate has a narrow guiding portion for receiving the guiding tab.

16. A computer comprising:
   a power supply having a front panel, a side panel and a back panel, at least one hook being formed on the side panel;
   a fixing member having a body;
   means for the fixing member slidably attached to the power supply; and
   a computer chassis comprising a side plate, at least one rack being formed on the chassis for supporting the power supply, at least one receiving slot being defined in the side plate for retaining said hook of the power supply, a bugle being formed on the chassis for abutting against the body of the fixing member when the fixing member is secured.

17. The computer power supply mounting apparatus as claimed in claim 16, wherein the fixing member having an U-shaped body with a first arm and a second arm parallel extending.

18. The computer power supply mounting apparatus as claimed in claim 17, means for the fixing member slidably attached to the power supply comprises at least one crook formed on the first arm of the fixing member and at least one groove defined in the power supply for receiving said crook.

19. The computer power supply mounting apparatus as claimed in claim 17, means for the fixing member slidably attached to the power supply comprises at least one screw attached to the power supply and at least one slot defined in the first arm for receiving said screw.

20. The computer power supply mounting apparatus as claimed in claim 16, wherein at least one post extends from the fixing member, and at least one receiving hole is defined in the chassis for retaining said post.

* * * * *